United States Patent
Kodama et al.

(10) Patent No.: US 10,818,428 B1
(45) Date of Patent: Oct. 27, 2020

(54) INDUCTOR BUILT-IN SUBSTRATE

(71) Applicant: IBIDEN CO., LTD., Ogaki (JP)

(72) Inventors: Hiroaki Kodama, Ogaki (JP); Kazuro Nishiwaki, Ogaki (JP); Kazuhiko Kuranobu, Ogaki (JP); Hiroaki Uno, Ogaki (JP)

(73) Assignee: IBIDEN CO., LTD., Ogaki (JP)

( * ) Notice: Subject to any disclaimer, the term of this patent is extended or adjusted under 35 U.S.C. 154(b) by 0 days.

(21) Appl. No.: 16/850,078

(22) Filed: Apr. 16, 2020

(30) Foreign Application Priority Data

Apr. 17, 2019 (JP) ................................ 2019-078599

(51) Int. Cl.

| | |
|---|---|
| H05K 1/16 | (2006.01) |
| H01F 27/40 | (2006.01) |
| H01F 27/24 | (2006.01) |
| H01F 27/28 | (2006.01) |
| H05K 1/11 | (2006.01) |
| H01F 41/04 | (2006.01) |
| H05K 3/42 | (2006.01) |

(52) U.S. Cl.
CPC ............. *H01F 27/40* (2013.01); *H01F 27/24* (2013.01); *H01F 27/2804* (2013.01); *H01F 41/041* (2013.01); *H05K 1/115* (2013.01); *H05K 1/165* (2013.01); *H05K 3/422* (2013.01); *H05K 3/424* (2013.01)

(58) Field of Classification Search
CPC .................................................... H05K 1/165
See application file for complete search history.

(56) References Cited

U.S. PATENT DOCUMENTS

| | | | |
|---|---|---|---|
| 2013/0223033 A1* | 8/2013 | Mano ...................... | H05K 1/18 361/763 |
| 2014/0020940 A1* | 1/2014 | Mano ................... | H05K 3/4697 174/258 |
| 2014/0091892 A1* | 4/2014 | Tominaga ........... | H01F 27/2804 336/200 |
| 2014/0118976 A1* | 5/2014 | Yoshikawa ......... | H01L 23/5383 361/763 |
| 2014/0353022 A1* | 12/2014 | Morita ................... | H05K 1/165 174/260 |

FOREIGN PATENT DOCUMENTS

JP 2016-197624 A1 11/2016

* cited by examiner

*Primary Examiner* — Hung V Ngo
(74) *Attorney, Agent, or Firm* — Oblon, McClelland, Maier & Neustadt, L.L.P.

(57) ABSTRACT

An inductor built-in substrate includes a core substrate having openings and first through holes, a magnetic resin filled in the openings and having second through holes, first through-hole conductors formed in the first through holes respectively such that each of the first through-hole conductors includes a metal film, second through-hole conductors formed in the second through holes respectively such that each of the second through-hole conductors includes a metal film, first through-hole lands formed on the core substrate such that each of the first through-hole lands includes a lowermost layer including a metal foil and that the first through-hole lands are connected to the first through-hole conductors respectively, and second through-hole lands formed on the magnetic resin such that each of the second through-hole lands includes a lowermost layer including a plating film and that the second through-hole lands are connected to the second through-hole conductors respectively.

20 Claims, 4 Drawing Sheets

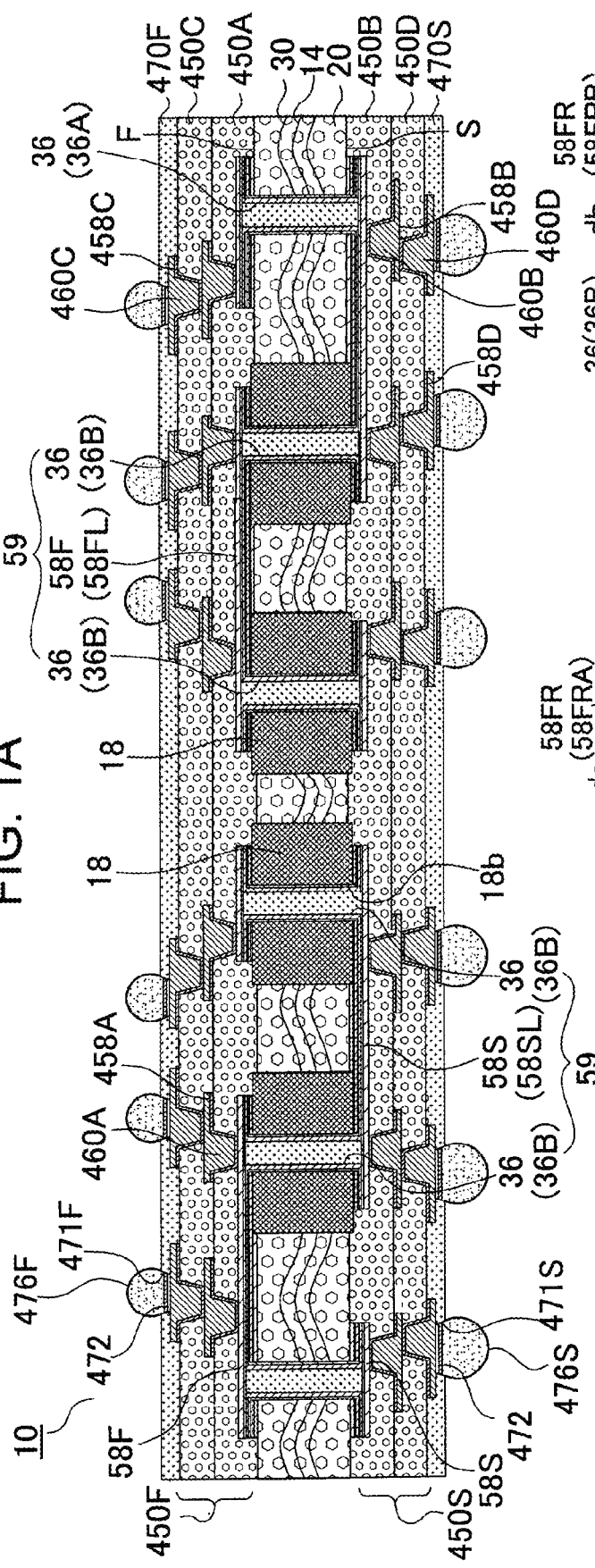
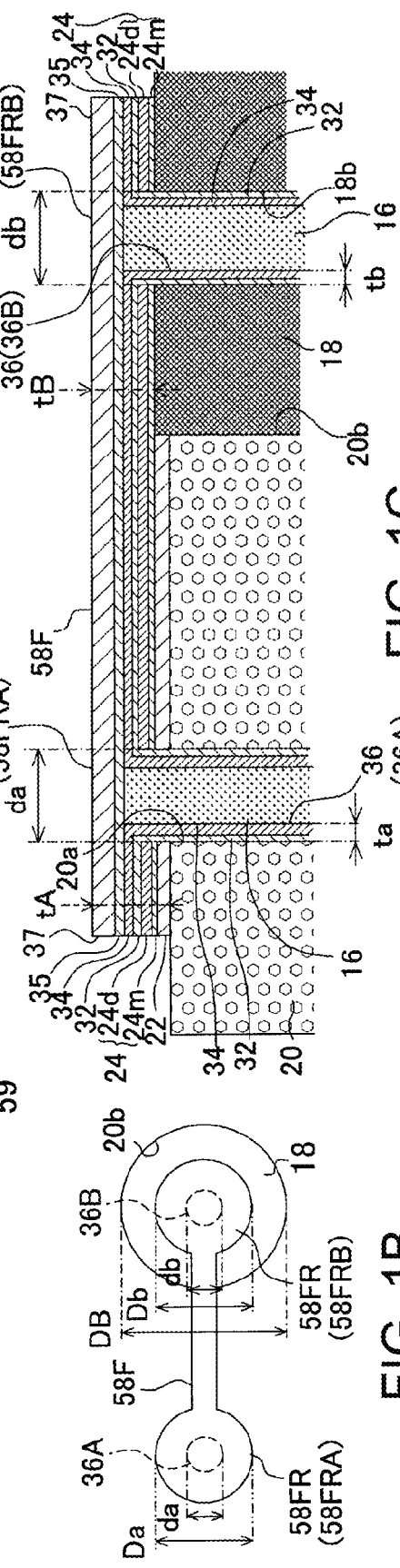
FIG. 1A
FIG. 1B
FIG. 1C

INDUCTOR BUILT-IN SUBSTRATE

CROSS-REFERENCE TO RELATED APPLICATIONS

The present application is based upon and claims the benefit of priority to Japanese Patent Application No. 2019-078599, filed Apr. 17, 2019, the entire contents of which are incorporated herein by reference.

BACKGROUND OF THE INVENTION

Field of the Invention

The present invention relates to an inductor built-in substrate that has an inductor built therein.

Description of Background Art

Japanese Patent Application Laid-Open Publication No. 2016-197624 describes a method for manufacturing an inductor component built in a wiring substrate. The entire contents of this publication are incorporated herein by reference.

SUMMARY OF THE INVENTION

According to one aspect of the present invention, an inductor built-in substrate includes a core substrate having openings and first through holes, a magnetic resin filled in the openings and having second through holes, first through-hole conductors formed in the first through holes respectively such that each of the first through-hole conductors includes a metal film, second through-hole conductors formed in the second through holes respectively such that each of the second through-hole conductors includes a metal film, first through-hole lands formed on the core substrate such that each of the first through-hole lands includes a lowermost layer including a metal foil and that the first through-hole lands are connected to the first through-hole conductors respectively, and second through-hole lands formed on the magnetic resin such that each of the second through-hole lands includes a lowermost layer including a plating film and that the second through-hole lands are connected to the second through-hole conductors respectively.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein:

FIG. 1A is a cross-sectional view of an inductor built-in substrate according to an embodiment of the present invention;

FIG. 1B is a plan view of through-hole lands;

FIG. 1C is an enlarged view of a core substrate of the inductor built-in substrate;

DETAILED DESCRIPTION OF THE EMBODIMENTS

Figure 2A:
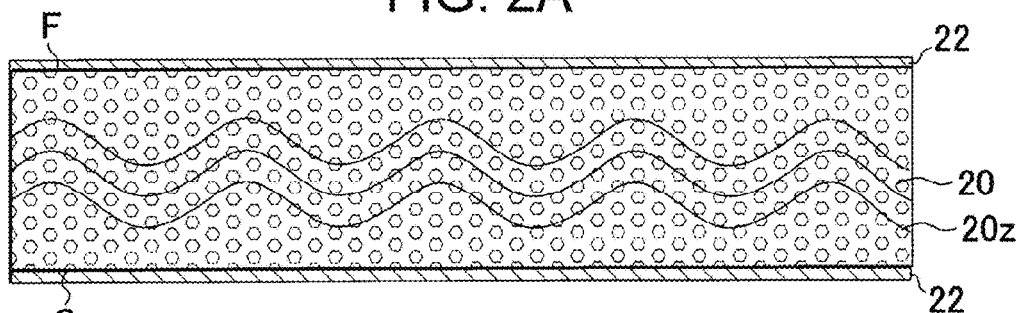
FIGS. 2A-2E are process diagrams illustrating a method for manufacturing an inductor built-in substrate according to an embodiment of the present invention.

Embodiments will now be described with reference to the accompanying drawings, wherein like reference numerals designate corresponding or identical elements throughout the various drawings.

FIG. 1A illustrates a cross-sectional view of an inductor built-in substrate 10 of an embodiment that has an inductor built therein. The inductor built-in substrate 10 has a core substrate 30 that is formed to include: an insulating base material 20 that has a first surface (F) and a second surface (S) on an opposite side with respect to the first surface (F); a first conductor layer (conductor circuit) (58F) on the first surface (F) of the insulating base material; a second conductor layer (58S) on the second surface (S) of the insulating base material; and through-hole conductors 36 that connect the first conductor layer (58F) and the second conductor layer (58S) to each other. The core substrate 30 has a first surface (F) and a second surface (S) on an opposite side with respect to the first surface (F). The first surface (F) of the core substrate 30 and the first surface (F) of the insulating base material 20 are the same surface, and the second surface (S) of the core substrate 30 and the second surface (S) of the insulating base material 20 are the same surface. The insulating base material 20 is formed of a resin such as an epoxy resin and a core material 14 such as a glass cloth for reinforcement. The insulating base material 20 may further contain inorganic particles such as silica particles.

The inductor built-in substrate 10 further has an upper side build-up layer (450F) formed on the first surface (F) of the core substrate 30. The upper side build-up layer (450F) includes: an insulating layer (450A) formed on the first surface (F) of the core substrate 30; a conductor layer (458A) formed on the insulating layer (450A); and via conductors (460A) penetrating the insulating layer (450A) and connecting the first conductor layer (58F) and the conductor layer (458A) to each other. The upper side build-up layer (450F) further includes: an insulating layer (450C) formed on the insulating layer (450A) and the conductor layer (458A); a conductor layer (458C) formed on the insulating layer (450C); and via conductors (460C) penetrating the insulating layer (450C) and connecting the conductor layer (458A) and the conductor layer (458C) to each other.

The inductor built-in substrate 10 further has a lower side build-up layer (450S) formed on the second surface (S) of the core substrate 30. The lower side build-up layer (450S) includes: an insulating layer (450B) formed on the second surface (S) of the core substrate 30; a conductor layer (458B) formed on the insulating layer (450B); and via conductors (460B) penetrating the insulating layer (450B) and connecting the second conductor layer (58S) and the conductor layer (458B) to each other. The lower side build-up layer (450S) further includes: an insulating layer (450D) formed on the insulating layer (450B) and the conductor layer (458B); a conductor layer (458D) formed on the insulating layer (450D); and via conductors (460D) penetrating the insulating layer (450D) and connecting the conductor layer (458B) and the conductor layer (458D) to each other.

The inductor built-in substrate of the embodiment further includes a solder resist layer (470F) having openings (471F) formed on the upper side build-up layer (450F) and a solder resist layer (470S) having openings (471S) formed on the lower side build-up layer (450S).

Upper surfaces of the conductor layers (458C, 458D) or the via conductors (460C, 460D) exposed from the openings (471F, 471S) of the solder resist layers (470F, 470S) function as pads. A protective film 472 formed of Ni/Au, Ni/Pd/Au, Pd/Au, OSP, or the like is formed on each of the pads. Solder bumps (476F, 476S) are respectively formed on the protective films. An IC chip (not illustrated in the drawings) is mounted on the inductor built-in substrate 10 via the solder bumps (476F) formed on the upper side build-up layer (450F). The inductor built-in substrate 10 is mounted on a motherboard via the solder bumps (476S) that are formed on the lower side build-up layer (450S).

FIG. 1C illustrates an enlarged view of a portion of the core substrate 30 in FIG. 1A. In the core substrate 30, the through-hole conductors 36 connecting the first conductor layer (58F) and the second conductor layer (58S) to each other include first through-hole conductors (36A) that are respectively formed in first through holes (20a) penetrating the core substrate 30 and second through-hole conductors (36B) that are respectively formed in second through holes (18b) of a magnetic resin 18 filled in openings (20b) of the core substrate 30. A diameter (da) of each of the first through holes (20a) and a diameter (db) of each of the second through holes (18b) are substantially equal to each other. A resin filler 16 is filled inside the first through-hole conductors (36A) and the second through-hole conductors (36B), and through-hole lands (58FR) are formed of cover plating. The through-hole lands (58FR) include first through-hole lands (58FRA) respectively formed on the first through-hole conductors (36A) and second through-hole lands (58FRB) respectively formed on the second through-hole conductors (36B).

FIG. 1B is a plan view of a first through-hole land (58FRA) formed on a first through-hole conductor (36A) and a second through-hole land (58FRB) formed on a second through-hole conductor (36B). The first through-hole land (58FRA) is concentrically formed with the first through-hole conductor (36A), and the second through-hole land (58FRB) is concentrically formed with the second through-hole conductor (36B). A diameter (Da) of the first through-hole land (58FRA) and a diameter (Db) of the second through-hole land (58FRB) are substantially equal to each other. The first through-hole land (58FRA) and the second through-hole land (58FRB) are connected to each other by the first conductor layer (circuit pattern) (58F). The diameter (Db) of the second through-hole land (58FRB) is smaller than a diameter (DB) of each of the openings (20b) in which the magnetic resin 18 is filled. That is, the second through-hole land (58FRB) does not spread from the magnetic resin 18 to the insulating base material 20.

The magnetic resin 18 contains an iron oxide filler (magnetic particles) and a resin such as an epoxy resin. Examples of the magnetic particles include iron oxide fillers such as FeO, $Fe_2O_3$, and $Fe_3O_4$ particles. A content of the iron oxide filler in the magnetic resin is preferably 60% by weight or more. From a point of view that the content of the iron oxide filler can be increased and magnetic permeability and heat conductivity can be increased, particle sizes of the iron oxide filler are desirably non-uniform.

As illustrated in FIG. 1C, a first through-hole conductor (36A) formed in a first through hole (20a) penetrating the core substrate 30 is in contact with the first through hole (20a). The first through-hole conductor (36A) includes a second electroless plating film 32 on the first through hole (20a), and a second electrolytic plating film 34 on the second electroless plating film 32. A second through-hole conductor (36B) formed in a second through hole (18b) penetrating the magnetic resin 18 is in contact with the second through hole (18b). The second through-hole conductor (36B) includes a second electroless plating film 32 on the second through hole (18b), and a second electrolytic plating film 34 on the second electroless plating film 32. A thickness (ta) of the second electroless plating film 32 and the second electrolytic plating film 34 that form the first through-hole conductor (36A) is larger than a thickness (tb) of the second electroless plating film 32 and the second electrolytic plating film 34 that form the second through-hole conductor (36B). When the thickness (ta) of the first through-hole conductor (36A) formed in the first through hole (20a) of the insulating base material 20 having a low heat conductivity is larger than the thickness (tb) of the second through-hole conductor (36B) formed in the second through hole (18b) of the magnetic resin 18 having a high heat conductivity, a balance in heat dissipation between the first through-hole conductor (36A) and the second through-hole conductor (36B) is adjusted.

The first through-hole lands (58FRA) and the first conductor layer (58F) on the insulating base material 20 are each formed of the copper foil 22 as a lowermost layer, the first electroless plating film (24m) on the copper foil 22, the first electrolytic plating film (24d) on the first electroless plating film (24m), the second electroless plating film 32 on the first electrolytic plating film (24d), the second electrolytic plating film 34 on the second electroless plating film 32, the third electroless plating film 35 on the second electrolytic plating film 34, and the third electrolytic plating film 37 on the third electroless plating film 35. The second through-hole lands (58FRB) and the first conductor layer (58F) on the magnetic resin 18 are each formed of the first electroless plating film (24m) as a lowermost layer, the first electrolytic plating film (24d) on the first electroless plating film (24m), the second electroless plating film 32 on the first electrolytic plating film (24d), the second electrolytic plating film 34 on the second electroless plating film 32, the third electroless plating film 35 on the second electrolytic plating film 34, and the third electrolytic plating film 37 on the third electroless plating film 35. The first electroless plating film (24m) and the first electrolytic plating film (24d) form a shield layer 24. A thickness (tA) of the first through-hole lands (58FRA) and the first conductor layer (58F) on the insulating base material 20 is larger than a thickness (tB) of the second through-hole lands (58FRB) and the first conductor layer (58F) on the magnetic resin 18 by a thickness of the copper foil 22. When the thickness (tA) of the first through-hole lands (58FRA) formed on the insulating base material 20 having a low heat conductivity is larger than the thickness (tB) of the second through-hole lands (58FRB) formed on the magnetic resin 18 having a high heat conductivity by the thickness of the copper foil 22 having a high heat conductivity, a balance in heat dissipation between the first through-hole conductors (36A) and the second through-hole conductors (36B) is adjusted.

In the core substrate 30 of the embodiment, the first conductor layer (58F) (connection pattern (58FL)) and the second conductor layer (58S) (connection pattern (58SL)) which are connected to each other via the second through-hole conductors (36B) formed in the magnetic resin 18 illustrated in FIG. 1A are arranged in a helical shape (a spiral shape along an axis in a direction parallel to the front and back surfaces of the core substrate), and together with the second through-hole conductors (36B) form an inductor 59.

In the inductor built-in substrate 10 of the embodiment, the first conductor layer (58F) and the second conductor layer (58S) are formed on the surfaces of the core substrate 30, and the second through-hole conductors (36B) connecting the first conductor layer (58F) and the second conductor layer (58S) to each other are directly formed in the second through holes (18b) penetrating the magnetic resin 18. Therefore, a ratio of a magnetic material in the inductor built-in substrate 10 is increased and an inductance can be increased.

Method for Manufacturing Inductor Built-in Substrate

A method for manufacturing an inductor built-in substrate according to an embodiment of the present invention is illustrated in FIGS. 2A-4C.

Figure 2B:
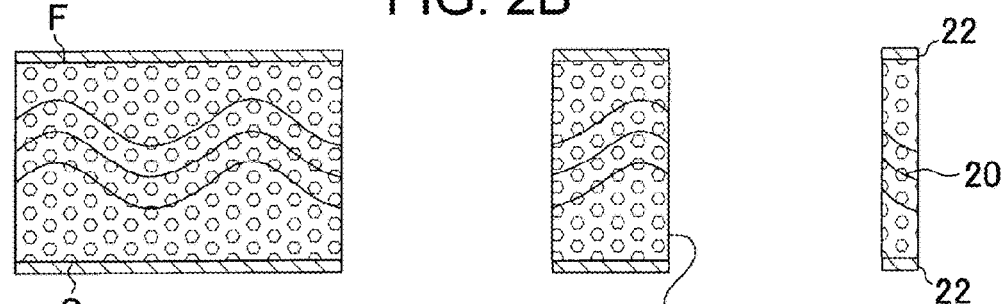
Figure 2C:
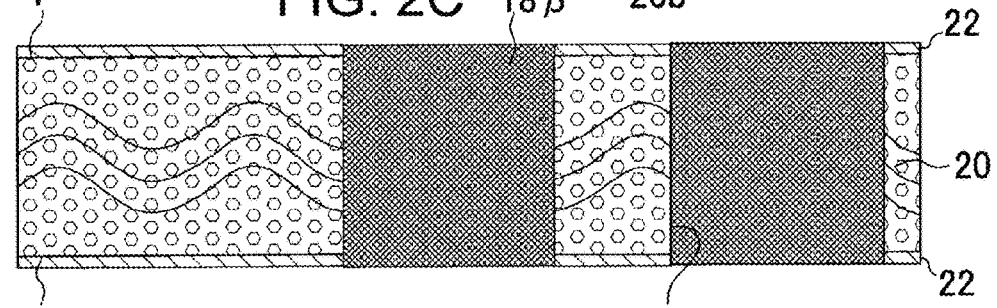

A substrate (20z) is prepared which is formed of a copper-clad laminated plate which is formed by laminating a copper foil 22 on both sides of the insulating base material 20 (FIG. 2A). The openings (20b) for filling the magnetic resin therein are formed in the insulating base material 20 (FIG. 2B). A resin paste containing an iron oxide filler (magnetic particles) in an amount of 90% by weight and an epoxy resin is vacuum-printed in the openings (20b). The resin paste is temporarily cured (semi-cured) at a temperature at which a viscosity of the resin paste is 2 or less times that at a normal temperature, and a temporarily cured magnetic resin (18β) is formed (FIG. 2C).

Figure 2D:
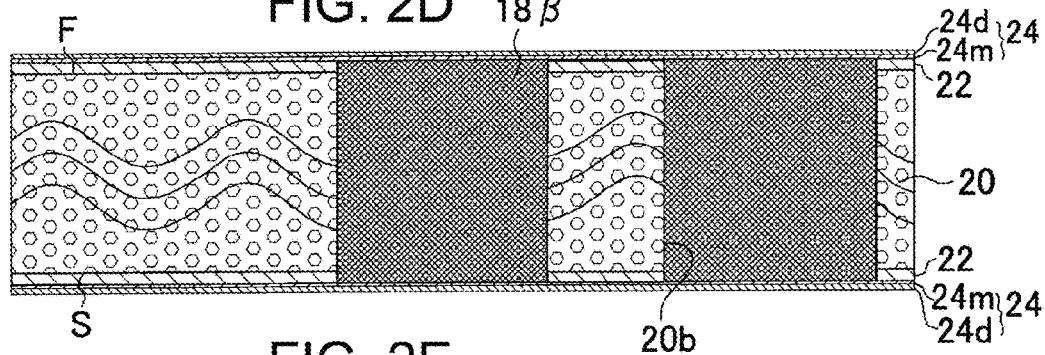

On a surface of the insulating base material 20 and a surface of the temporarily cured magnetic resin (18β) exposed from the openings (20b), a first electroless plating film (24m) is formed by an electroless plating treatment, and a first electrolytic plating film (24d) is formed by an electrolytic plating treatment (FIG. 2D). The first electroless plating film (24m) and the first electrolytic plating film (24d) form a shield layer 24.

Figure 2E:
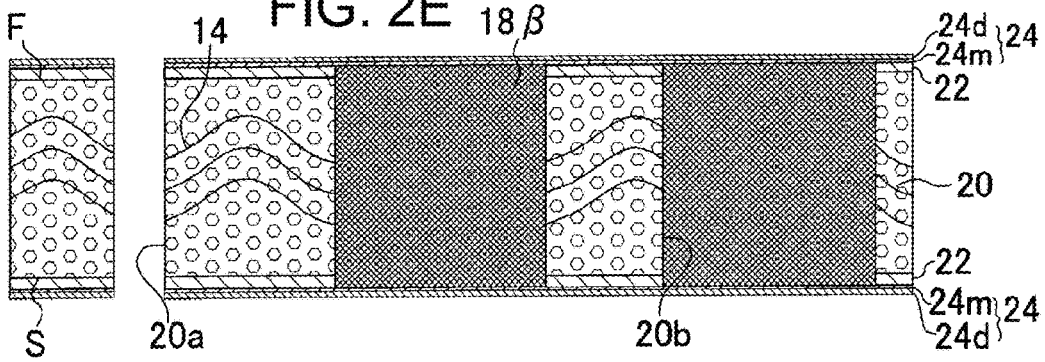

The first through holes (20a) are formed in the insulating base material 20 by mechanical drilling, laser processing, or the like (FIG. 2E). Thereafter, the first through holes (20a) are subjected to a desmear treatment using a chemical solution. During the desmear treatment, the temporarily cured magnetic resin (18β) covered by a shield layer 24 formed by the first electroless plating film (24m) and the first electrolytic plating film (24d) is not affected by the chemical solution. The iron oxide filler on the surface of the temporarily cured magnetic resin (18β) is not affected by the desmear treatment.

Figure 3A:
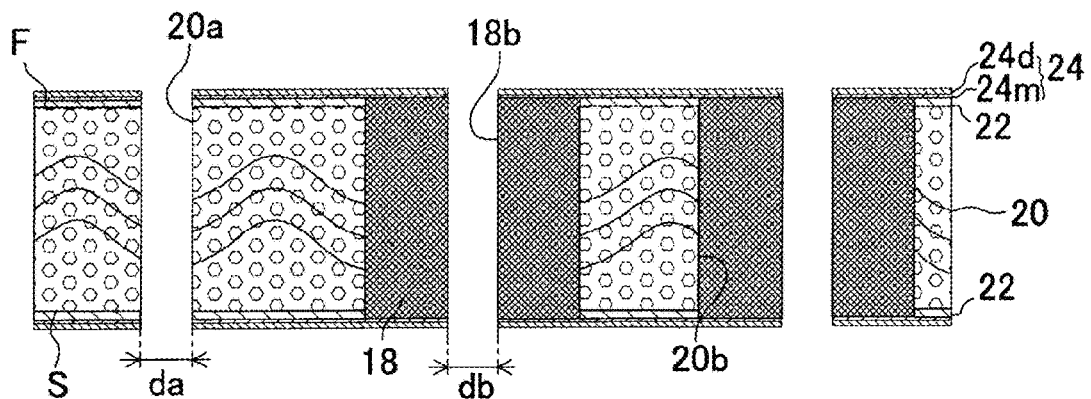
FIGS. 3A-3D are process diagrams illustrating the method for manufacturing the inductor built-in substrate according to the embodiment.
Figure 3B:
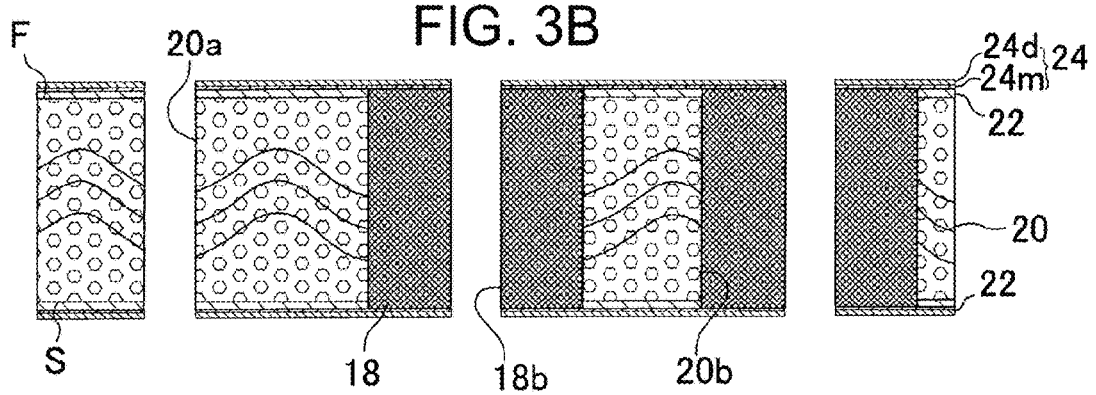
Figure 3C:
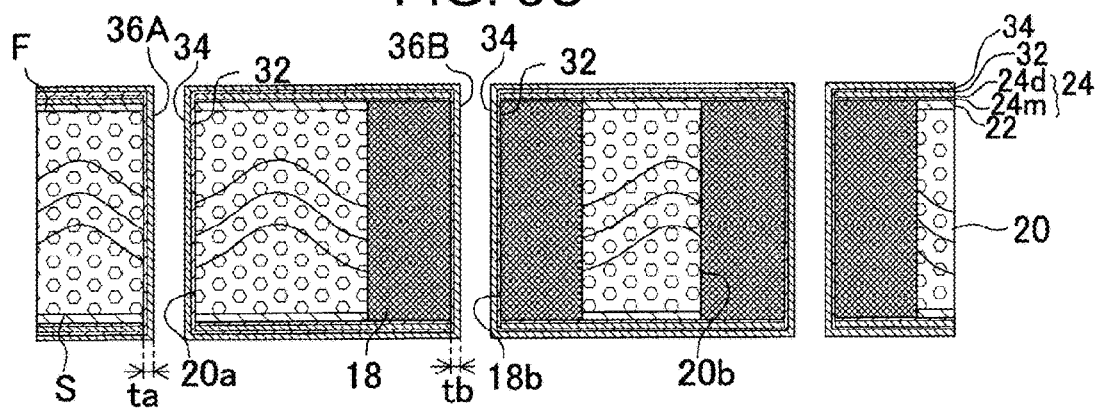

The second through holes (18b) are formed in the temporarily cured magnetic resin (18β) by mechanical drilling, laser processing, or the like. In this embodiment, since the iron oxide filler is contained in an amount of 90% by weight, through hole formation after fully curing is not easy. However, since the through holes are formed before fully curing, the through holes can be easily formed. The magnetic material layer in a temporarily cured state is heated to cause the resin contained therein to crosslink, and thereby, the magnetic material layer is fully cured to form the magnetic resin 18 (FIG. 3A). Here, heating is performed at 150° C.-190° C. for one hour. By high-pressure water washing, processing smear occurred during through hole formation is removed (FIG. 3B). Desmearing is performed using an alkaline agent. However, there is a risk that an alkaline agent may cause the iron oxide filler contained in the magnetic resin 18 to fall off during a process in which the resin is swelled and peeled off Therefore, here, high-pressure water washing is performed. On the first electrolytic plating film (24d) on the surfaces of the insulating base material 20 and the magnetic resin 18 and on surfaces of the first through holes (20a) and the second through holes (18b), a second electroless plating film 32 is formed by an electroless plating treatment and a second electrolytic plating film 34 is formed by an electrolytic plating treatment. By the second electroless plating film 32 and the second electrolytic plating film 34, the first through-hole conductors (36A) are formed in the first through holes (20a) and the second through-hole conductors (36B) are formed in the second through holes (18b) (FIG. 3C).

Figure 3D:
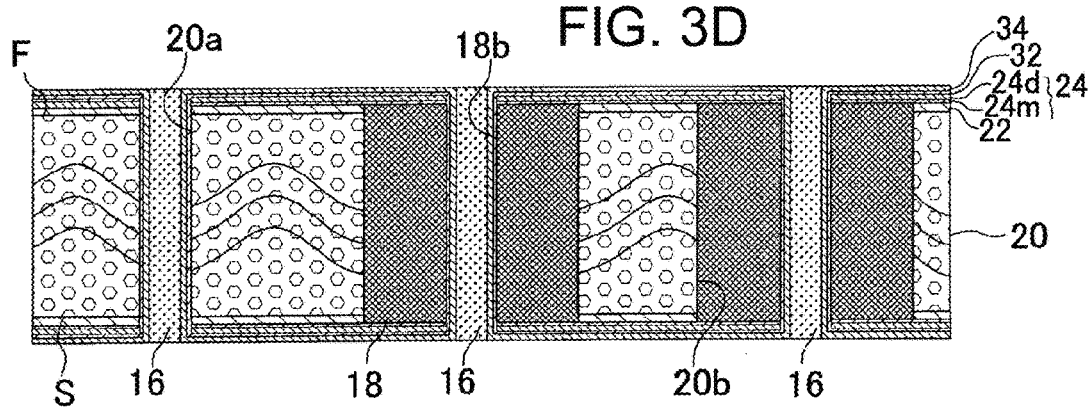
Figure 4A:
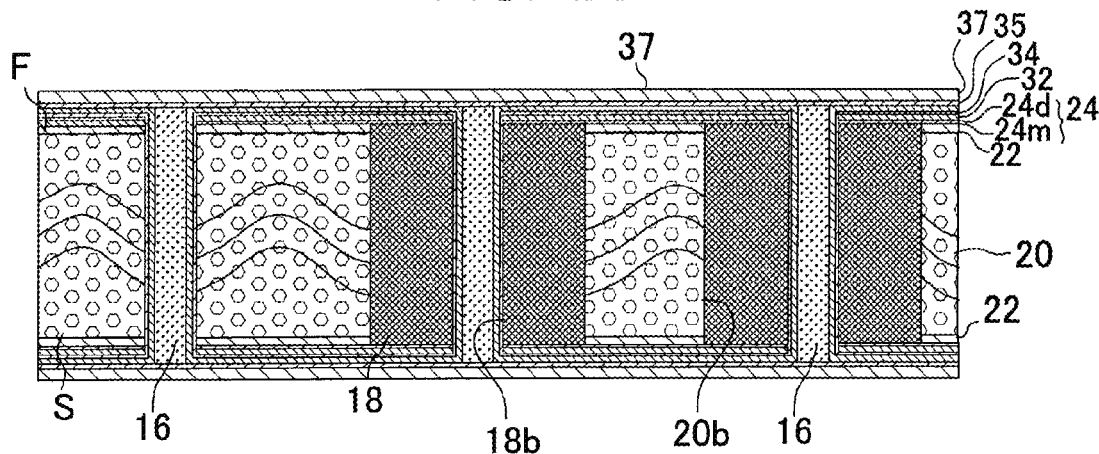
FIGS. 4A-4C are process diagrams illustrating the method for manufacturing the inductor built-in substrate according to the embodiment.
Figure 4B:
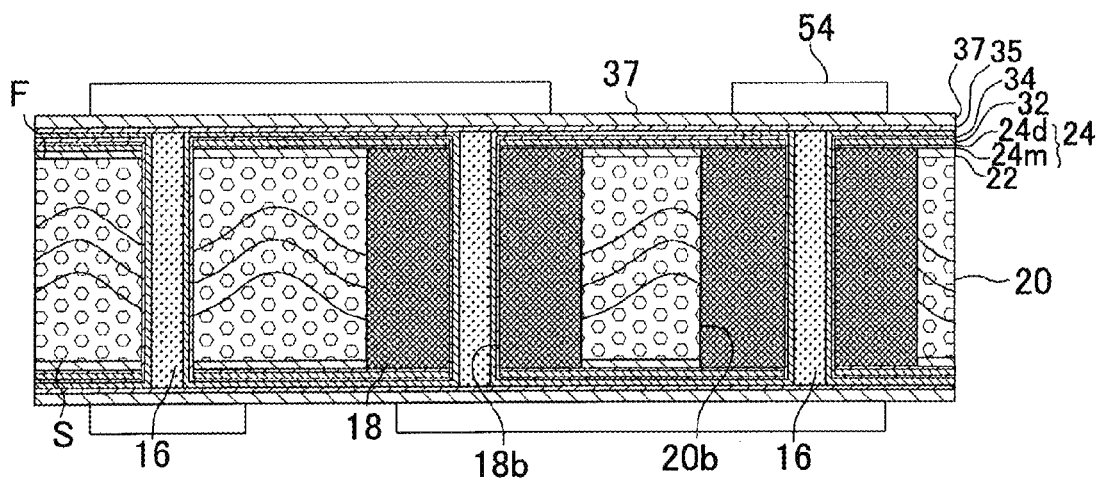

The resin filler 16 is filled inside the first through-hole conductors (36A) formed in the first through holes (20a) and inside the second through-hole conductors (36B) formed in the second through holes (18b), and the surfaces of the core substrate 30 are polished (FIG. 3D). A third electroless plating film 35 is formed by electroless plating on the second electrolytic plating film 34 and on exposed surfaces of the resin filler 16, and a third electrolytic plating film 37 is formed on the third electroless plating film 35 (FIG. 4A). An etching resist 54 of a predetermined pattern is formed on the third electrolytic plating film 37 (FIG. 4B).

Figure 4C:
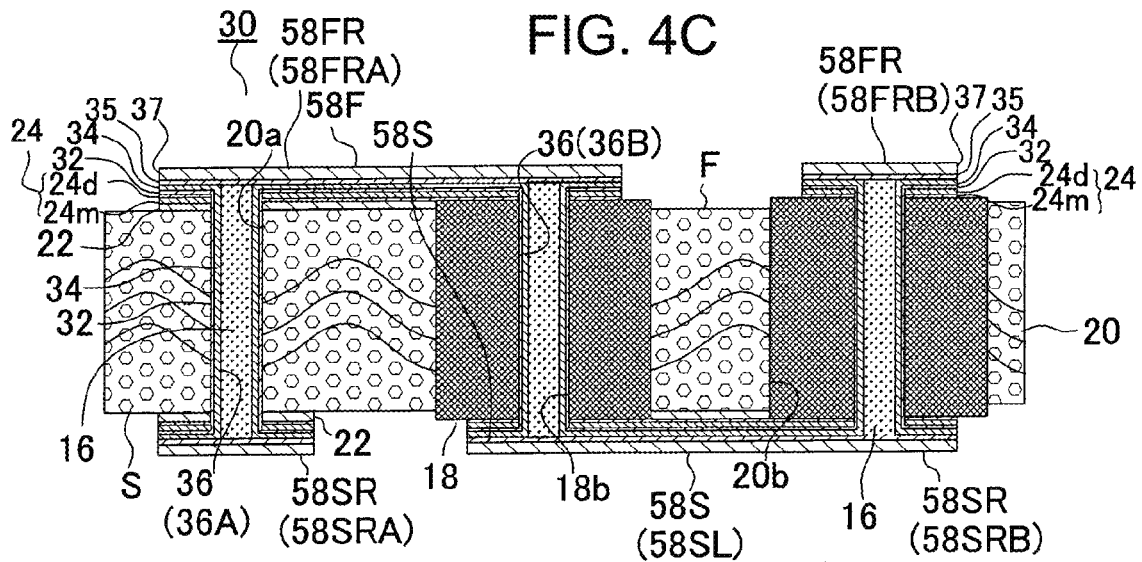

The third electrolytic plating film 37, the third electroless plating film 35, the second electrolytic plating film 34, the second electroless plating film 32, the first electrolytic plating film (24d), the first electroless plating film (24m), and the copper foil 22 exposed from the etching resist 54 are removed, and thereafter, the etching resist is removed, and the first conductor layer (58F), the second conductor layer (58S) are formed and the core substrate 30 is completed (FIG. 4C). The first conductor layer (58F) and the second conductor layer (58S) on the insulating base material 20 and the first through-hole lands (58FRA) on the first surface side of the first through-hole conductors (36A) and first through-hole lands (58SRA) on the second surface side of the first through-hole conductors (36A) are each formed of the copper foil 22 as a lowermost layer, the first electroless plating film (24m) on the copper foil 22, the first electrolytic plating film (24d) on the first electroless plating film (24m), the second electroless plating film 32 on the first electrolytic plating film (24d), the second electrolytic plating film 34 on the second electroless plating film 32, the third electroless plating film 35 on the second electrolytic plating film 34, and the third electrolytic plating film 37 on the third electroless plating film 35. The first conductor layer (58F) and the second conductor layer (58S) on the magnetic resin 18 and the second through-hole lands (58FRB) on the first surface side of the second through-hole conductors (36B) and second through-hole lands (58SRB) on the second surface side of the second through-hole conductors (36B) are each formed of the first electroless plating film (24m), the first electrolytic plating film (24d) on the first electroless plating film (24m), the second electroless plating film 32 on the first electrolytic plating film (24d), the second electrolytic plating film 34 on the second electroless plating film 32, the third electroless plating film 35 on the second electrolytic plating film 34, and the third electrolytic plating film 37 on the third electroless plating film 35.

The upper side build-up layer (450F), the lower side build-up layer (450S), the solder resist layers (470F, 470S), and the solder bumps (476F, 476S) are formed on the core substrate 30 using known manufacturing methods (FIG. 1A).

In the method for manufacturing the inductor built-in substrate of the embodiment, the second through-hole conductors (36B) formed of the second electroless plating film 32 and the second electrolytic plating film 34 are formed in the second through holes (18b) of the magnetic resin 18. Therefore, the volume of the magnetic resin 18 of the inductor built-in substrate 10 can be increased, and the inductance can be increased.

In Japanese Patent Application Laid-Open Publication No. 2016-197624, a magnetic material is accommodated in a resin layer, through-hole conductors are provided in the resin layer, and the through-hole conductors are prevented from being in contact with the magnetic material.

In Japanese Patent Application Laid-Open Publication No. 2016-197624, since the through-hole conductors are formed in the resin layer, it is thought that a ratio of the magnetic material with respect to a size of the inductor component is low and it is difficult to increase an inductance.

An inductor built-in substrate according to an embodiment of the present invention has high heat dissipation performance, is small in size, and has a large inductance.

An inductor built-in substrate according to an embodiment of the present invention includes: a core substrate in which openings and first through holes are formed; a magnetic resin filled in the openings and having second through holes; first through-hole conductors formed of metal films formed in the first through holes; first through-hole lands of the first through-hole conductors formed on the core substrate; second through-hole conductors formed of metal films formed in the second through holes; and second through-hole lands of the second through-hole conductors formed on the magnetic resin. Lowermost layers of the first through-hole lands are metal foils, and lowermost layers of the second through-hole lands are plating films.

In an inductor built-in substrate according to an embodiment of the present invention, the second through-hole conductor formed of a metal film is directly formed in the second through hole of the magnetic resin. Therefore, a volume of the magnetic resin of an inductor component can be increased, and an inductance can be increased. For the first through-hole land formed in the core substrate having low heat dissipation performance, a metal foil is arranged as a lowermost layer and heat dissipation performance is improved.

Obviously, numerous modifications and variations of the present invention are possible in light of the above teachings. It is therefore to be understood that within the scope of the appended claims, the invention may be practiced otherwise than as specifically described herein.

What is claimed is:

1. An inductor built-in substrate, comprising:
   a core substrate having a plurality of openings and a plurality of first through holes;
   a magnetic resin filled in the openings and having a plurality of second through holes;
   a plurality of first through-hole conductors formed in the plurality of first through holes respectively such that each of the first through-hole conductors comprises a metal film;
   a plurality of second through-hole conductors formed in the plurality of second through holes respectively such that each of the second through-hole conductors comprises a metal film;
   a plurality of first through-hole lands formed on the core substrate such that each of the first through-hole lands includes a lowermost layer comprising a metal foil and that the plurality of first through-hole lands is connected to the plurality of first through-hole conductors respectively; and
   a plurality of second through-hole lands formed on the magnetic resin such that each of the second through-hole lands includes a lowermost layer comprising a plating film and that the plurality of second through-hole lands is connected to the plurality of second through-hole conductors respectively.

2. The inductor built-in substrate according to claim 1, wherein the plurality of first through-hole lands is formed such that each of the first through-hole lands includes the metal film extending from a respective one of the first through-hole conductors, and a shield layer formed on a core substrate side of the metal film, and the plurality of second through-hole lands is formed such that each of the second through-hole lands includes the metal film extending from a respective one of the second through-hole conductors, and a shield layer formed on a magnetic resin side of the metal film.

3. The inductor built-in substrate according to claim 2, wherein the plurality of first through-hole lands is formed such that each of the first through-hole lands includes the shield layer comprising an electroless plating film and an electrolytic plating film, and the plurality of second through-hole lands is formed such that each of the second through-hole lands includes the shield layer comprising an electroless plating film and an electrolytic plating film.

4. The inductor built-in substrate according to claim 3, wherein the magnetic resin includes an iron oxide filler in an amount of 60% by weight or more.

5. The inductor built-in substrate according to claim 4, wherein the plurality of first through-hole conductors is formed such that each of the first through-hole conductors includes the metal film comprising an electroless plating film and an electrolytic plating film, and the plurality of second through-hole conductors is formed such that each of the second through-hole conductors includes the metal film comprising an electroless plating film and an electrolytic plating film.

6. The inductor built-in substrate according to claim 4, wherein the plurality of first through-hole conductors and the plurality of second through-hole conductors are formed such that the metal film in each of the first through-hole conductors has a thickness that is greater than a thickness of the metal film in each of the second through-hole conductors.

7. The inductor built-in substrate according to claim 3, wherein the plurality of first through-hole conductors is formed such that each of the first through-hole conductors includes the metal film comprising an electroless plating film and an electrolytic plating film, and the plurality of second through-hole conductors is formed such that each of the second through-hole conductors includes the metal film comprising an electroless plating film and an electrolytic plating film.

8. The inductor built-in substrate according to claim 3, wherein the plurality of first through-hole conductors and the plurality of second through-hole conductors are formed such that the metal film in each of the first through-hole conductors has a thickness that is greater than a thickness of the metal film in each of the second through-hole conductors.

9. The inductor built-in substrate according to claim 2, wherein the magnetic resin includes an iron oxide filler in an amount of 60% by weight or more.

10. The inductor built-in substrate according to claim 2, wherein the plurality of first through-hole conductors is formed such that each of the first through-hole conductors includes the metal film comprising an electroless plating film and an electrolytic plating film, and the plurality of second through-hole conductors is formed such that each of the second through-hole conductors includes the metal film comprising an electroless plating film and an electrolytic plating film.

11. The inductor built-in substrate according to claim 2, wherein the plurality of first through-hole conductors and the plurality of second through-hole conductors are formed such that the metal film in each of the first through-hole conductors has a thickness that is greater than a thickness of the metal film in each of the second through-hole conductors.

12. The inductor built-in substrate according to claim 1, wherein the magnetic resin includes an iron oxide filler in an amount of 60% by weight or more.

13. The inductor built-in substrate according to claim 12, wherein the plurality of first through-hole conductors is formed such that each of the first through-hole conductors includes the metal film comprising an electroless plating film and an electrolytic plating film, and the plurality of second through-hole conductors is formed such that each of the second through-hole conductors includes the metal film comprising an electroless plating film and an electrolytic plating film.

14. The inductor built-in substrate according to claim 12, wherein the plurality of first through-hole conductors and the plurality of second through-hole conductors are formed such that the metal film in each of the first through-hole conductors has a thickness that is greater than a thickness of the metal film in each of the second through-hole conductors.

15. The inductor built-in substrate according to claim 1, wherein the plurality of first through-hole conductors is formed such that each of the first through-hole conductors includes the metal film comprising an electroless plating film and an electrolytic plating film, and the plurality of second through-hole conductors is formed such that each of the second through-hole conductors includes the metal film comprising an electroless plating film and an electrolytic plating film.

16. The inductor built-in substrate according to claim 15, wherein the plurality of first through-hole conductors and the plurality of second through-hole conductors are formed such that the metal film in each of the first through-hole conductors has a thickness that is greater than a thickness of the metal film in each of the second through-hole conductors.

17. The inductor built-in substrate according to claim 1, wherein the plurality of first through-hole conductors and the plurality of second through-hole conductors are formed such that the metal film in each of the first through-hole conductors has a thickness that is greater than a thickness of the metal film in each of the second through-hole conductors.

18. The inductor built-in substrate according to claim 1, wherein the plurality of first through holes and the plurality of second through holes are formed such that a diameter of each of the first through holes is substantially equal to a diameter of each of the second through holes.

19. The inductor built-in substrate according to claim 1, wherein the plurality of first through-hole lands and the plurality of second through-hole lands are formed such that a diameter of each of the first through-hole lands is substantially equal to a diameter of each of the second through-hole lands.

20. The inductor built-in substrate according to claim 1, wherein the plurality of second through-hole lands is formed such that a diameter of each of the second through-hole lands is smaller than a diameter of each of the openings in which the magnetic resin is filled.

* * * * *